United States Patent [19]
Gardner et al.

[11] Patent Number: 5,940,707
[45] Date of Patent: *Aug. 17, 1999

[54] VERTICALLY INTEGRATED ADVANCED TRANSISTOR FORMATION

[75] Inventors: Mark I. Gardner, Cedar Creek; Michael Duane, Austin, both of Tex.

[73] Assignee: Advanced Micro Devices, Inc.

[*] Notice: This patent issued on a continued prosecution application filed under 37 CFR 1.53(d), and is subject to the twenty year patent term provisions of 35 U.S.C. 154(a)(2).

[21] Appl. No.: 08/729,801

[22] Filed: Oct. 8, 1996

[51] Int. Cl.⁶ .................................................. H01L 21/336
[52] U.S. Cl. ........................ 438/270; 438/589; 438/296
[58] Field of Search ..................... 438/301, 303, 438/305, 307, 589, 296, 259, 268, 270

[56] References Cited

U.S. PATENT DOCUMENTS

| | | |
|---|---|---|
| 4,683,643 | 8/1987 | Nakajima et al. . |
| 5,021,355 | 6/1991 | Dhong et al. . |
| 5,045,490 | 9/1991 | Esquivel et al. ........................ 438/589 |
| 5,177,028 | 1/1993 | Manning ................................. 438/296 |
| 5,180,680 | 1/1993 | Yang ...................................... 438/589 |
| 5,250,450 | 10/1993 | Lee et al. . |
| 5,464,780 | 11/1995 | Yamazaki ............................... 438/589 |
| 5,480,819 | 1/1996 | Huang . |
| 5,705,415 | 1/1998 | Orlowski ................................ 428/259 |
| 5,719,067 | 2/1998 | Gardner et al. . |

OTHER PUBLICATIONS

Wolf et al., "Silicon Processing for the VLSI Era vol. 1: Process Integration", pp. 168–169, Lattice Press, 1986.

*Primary Examiner*—Richard A. Booth
*Attorney, Agent, or Firm*—Kevin L. Daffer; Conley, Rose & Tayon

[57] ABSTRACT

A field-effect transistor and method for making same in which a first source/drain impurity distribution is located at a first depth below an upper surface of the semiconductor substrate and a second source/drain impurity distribution is located at a second depth below the upper surface. In a presently preferred embodiment, the first depth is greater than the second depth such that the transistor includes a channel region having a vertical component. The channel region extends from the first source/drain impurity distribution to the second source/drain impurity distribution. The field-effect transistor further includes a gate dielectric which is in contact with the channel region and a conductive gate structure in contact with the gate dielectric layer. The conductive gate structure has substantially vertical interior and exterior sidewalls. The vertical component of the transistor channel length can be accurately controlled with plasma etch techniques. In this manner, the transistor channel length is not defined by a photolithography process and, therefore, dimensions less than the minimum feature size resolvable by a photolithography aligner can be achieved.

8 Claims, 5 Drawing Sheets

VERTICALLY INTEGRATED ADVANCED TRANSISTOR FORMATION

BACKGROUND OF THE INVENTION

1. Field of the Invention

This invention relates to the field of semiconductor processing and, more particularly, to a transistor and fabrication method for forming such a transistor in which a first source/drain region is formed below a second source/drain region such that the transistor channel has a vertical component.

2. Description of Relevant Art

Universal fabrication of field-effect transistors is well known. The manufacturing process begins by lightly doping a single crystal silicon substrate with an ntype or p-type impurity. The specific area where the transistor will be formed is then isolated from other areas on the substrate with the use of isolation structures. In modern fabrication laboratories, the isolation structures may comprise shallow trenches in the substrate filled with a dielectric such as oxide to insulate the transistors from one another. Isolation structures may alternatively comprise, for example, local oxidation of silicon ("LOCOS") structures which are well known in the art. A gate dielectric may be formed by thermal oxidation of the silicon substrate. The gate structure is then patterned after depositing a layer of polycrystalline silicon ("polysilicon") over the gate dielectric. Subsequently, the polysilicon and the source and drain regions are doped, via ion implantation, with an n-type or p-type dopant. When voltage above a certain threshold is applied to the gate, the channel between the source and drain regions becomes conductive and the transistor turns on.

The operating characteristics of field-effect transistors fabricated with standard metal-oxide-semiconductor ("MOS") integrated circuit techniques are a function of the transistor's dimensions. In particular, the source-to-drain current ($I_{ds}$) is proportional to the ratio of the transistor's width (W) to the transistor's length (L). For given transistor width and a given biasing condition (e.g. $V_G$=3V, $V_D$=3V, and $V_{s=OV}$), $I_{ds}$ is maximized by minimizing the transistor length L. Minimizing transistor channel length also improves the speed of integrated circuits comprised of a large number of individual transistors because the larger drain current associated with a short channel length can drive the adjoining transistors into saturation more quickly. Minimizing L is, therefore, desirable from a device operation standpoint. In addition, minimizing the transistor length L is desirable from a manufacturing perspective because a smaller area of silicon is required to manufacture a transistor having a smaller length. By minimizing the area required for a given transistor, the number of transistors available for a given area of silicon increases and, with it, a corresponding increase in the circuit complexity that can be achieved on the given area of silicon.

The main limitation of minimum device size in a conventional transistor fabrication process is the resolution of the optical lithography printing system. In an optical lithography printing system, radiation is directed from an illumination source through a patterned mask and onto a photoresist layer. The patterned mask transmits the illumination source radiation onto selected areas of the photoresist layer to reproduce the mask pattern in the photoresist layer. Resolution in optical lithography systems is limited by diffraction effects, which spread radiation from the illumination source into regions of the photoresist which are not directly exposed to the illumination source. Because of diffraction effects, there is a minimum distance beyond which even a geometrically perfect lens cannot resolve two points. In other words, when two points are less than a minimum distance from each other, the two points cannot be resolved by the lithography system. The diffraction patterns associated with each point overlap each other to such an extent that the two points cannot be effectively differentiated. The resolution of a lens depends on the wavelength of the illumination source and the numerical aperture of the lens. Rayleighs criteria defines two images as being resolvable when the intensity between them drops to 80% of the image intensity. This criteria is satisfied when the 2d=0.61λ/NA. Where 2d is the separation distance of two images, λ is the wavelength of the energy source, and NA is the numerical aperture of the lens.

Commercially available optical photolithography machines are typically equipped with mercury vapor lamps as the illumination source. The characteristic energy spectrum of a mercury vapor lamp contains several distinct peaks in the 300nm to 450nm wavelength range. These peaks are commonly referred to by their industry designations. The peak associated with a wavelength of ~436nm is designated the "G-line," the ~405nm peak the "H-line," and the ~370nm peak the "I-line." Photolithography aligners are similarly designated such that it is common to speak of "G-line aligners." The minimum feature size resolvable by a G-line aligner is greater than the minimum feature size of an I-line aligner because of the longer G-line wavelength.

As process technologies approach and surpass the resolvable limits of G-line and I-line aligners, semiconductor manufacturers are typically forced to implement alternative photolithography techniques to achieve adequate resolution of the minimum features. Unfortunately, the conventional alternatives involve abandoning or substantially modifying the existing photolithography equipment at a prohibitive cost. In addition to the capital required to purchase and install the improved equipment, there are extensive costs associated with qualifying the new equipment for production worthiness and training production and maintenance personnel in the operation and care of the new equipment. Therefore, it is highly desirable to design an MOS transistor and a transistor fabrication process in which the transistor channel length is not limited by the capabilities of the photolithography equipment.

SUMMARY OF THE INVENTION

The problems identified above are in large part addressed by a field-effect transistor and a transistor fabrication method in which the source/drain regions of the transistor are vertically displaced from each other. By vertically displacing the source/drain regions of the transistor, the transistor channel length has a vertical component. The dimension of this vertical component of the transistor channel length can be accurately controlled with plasma etch techniques. In this manner, the transistor channel length is not defined by a photolithography process and, therefore, dimensions smaller than the minimum feature size resolvable by a photolithography aligner can be achieved.

In a preferred embodiment, the transistor includes a semiconductor substrate with at least one isolation structure. The isolation structure forms a rectangular ring around the active region of the transistor and may comprise shallow trenches filled with oxide or LOCOS structures. The transistor further includes a first source/drain region impurity distribution which is located at a first depth below the upper surface of the semiconductor substrate. A second source/drain region impurity distribution is located a second depth below the semiconductor substrate, with the second depth less than the first depth. The first and second impurity distributions may comprise n-type or -p-type dopants. Boron may be used as a p-type dopant and arsenic or phosphorus may be used as an n-type dopant. Peak impurity concentrations are preferably greater than approximately $10^{19}$ atoms/cm$^3$.

The transistor further includes a channel region within the semiconductor extending from the first to the second source/drain impurity distributions. A channel trench is formed by etching a void in the semiconductor substrate. The channel trench comprises trench sidewalls and a trench floor. The trench walls are substantially perpendicular to the upper surface of the semiconductor surface and the trench floor is located a trench depth below the upper surface of the semiconductor surface. The trench depth is less than the first depth above but greater than the second one such that the first source/drain region impurity distribution is located below the trench floor. A uniform thickness oxide layer, serving as the gate dielectric, is in contact with the trench floor, the trench sidewalls, and the upper surface of the semiconductor surface immediately outside the trench. The oxide layer has a thickness approximately between 15 and 200 Å. The transistor further includes a conductive gate structure in contact with the gate dielectric along the trench sidewalls. The conductive gate structure comprises substantially vertical interior and exterior sidewalls. The exterior sidewalls are in contact with the gate dielectric along the trench sidewalls. The conductive gate structure preferably comprises polycrystalline silicon ("polysilicon") having a sheet resistivity of less than approximately 500 Ω/sq.

The present invention further contemplates a process for forming a field-effect transistor. A semiconductor substrate is provided. At least one isolation structure is formed in the shape of a rectangular ring. The isolation structure surrounds and electrically isolates the active region of the transistor and may comprise shallow trenches filled with a dielectric oxide. Alternatively, LOCOS isolation may be used. A channel trench is then formed in a channel trench region of the active region. The channel trench comprises trench sidewalls and a trench floor located a trench depth below the upper surface of the semiconductor substrate.

A first impurity distribution is then introduced into the first source/drain region located a first depth below the upper surface of the semiconductor; the first depth being greater than the trench depth above. The introduction of the first impurity distribution into the first source/drain region may comprise implantation of a p-type dopant such as boron or n-type dopants selected from the group consisting of phosphorus and arsenic, with a peak dopant concentration preferably greater than approximately $10^{19}$ atoms/cm$^3$. A gate dielectric of substantially uniform thickness is then formed in contact with the trench floor, the trench sidewalls, and the upper surface of the semiconductor substrate. The gate dielectric is preferably grown by thermally oxidizing the semiconductor surface to a thickness of approximately between 15and 200 Å.

A conductive gate structure or a plurality of conductive gate structures is then formed in contact with the gate dielectric on the trench sidewalls. The formation step preferably includes chemically vapor depositing polysilicon into the channel trench. Subsequently, n-type or p-type impurities are introduced into the polysilicon such that a sheet resistivity of the polysilicon is less than approximately 500 Ω/sq. At the same time, dopants may also be introduced into a second source/drain region located a second depth below the upper surface of the semiconductor substrate to the exterior of the channel trench. The second depth is less than the trench depth (which trench depth is less than the first depth). A layer of photoresist is then blanket-deposited over the entire transistor region. Subsequently, the photoresist is patterned such that a region of the polysilicon is exposed. The exposed region of the polysilicon is then etched to form the conductive gate structure. The conductive gate structure comprises substantially vertical exterior and substantially vertical interior sidewalls. The exterior sidewalls are in contact with the gate dielectric. Depending on how the photoresist layer is patterned, the gate structure may comprise one or more separate portions. One or more transistors having a common source and drain but separate gates may be formed using this method.

BRIEF DESCRIPTION OF THE DRAWINGS

Other objects and advantages of the invention will become apparent upon reading the following detailed description and upon reference to the accompanying drawings in which:

FIG. 1b is a partial cross-sectional view of the semiconductor substrate of FIG. 1a;

FIG. 7b is a partial top-plan view of the transistor of FIG. 7a.

Figure 1A:
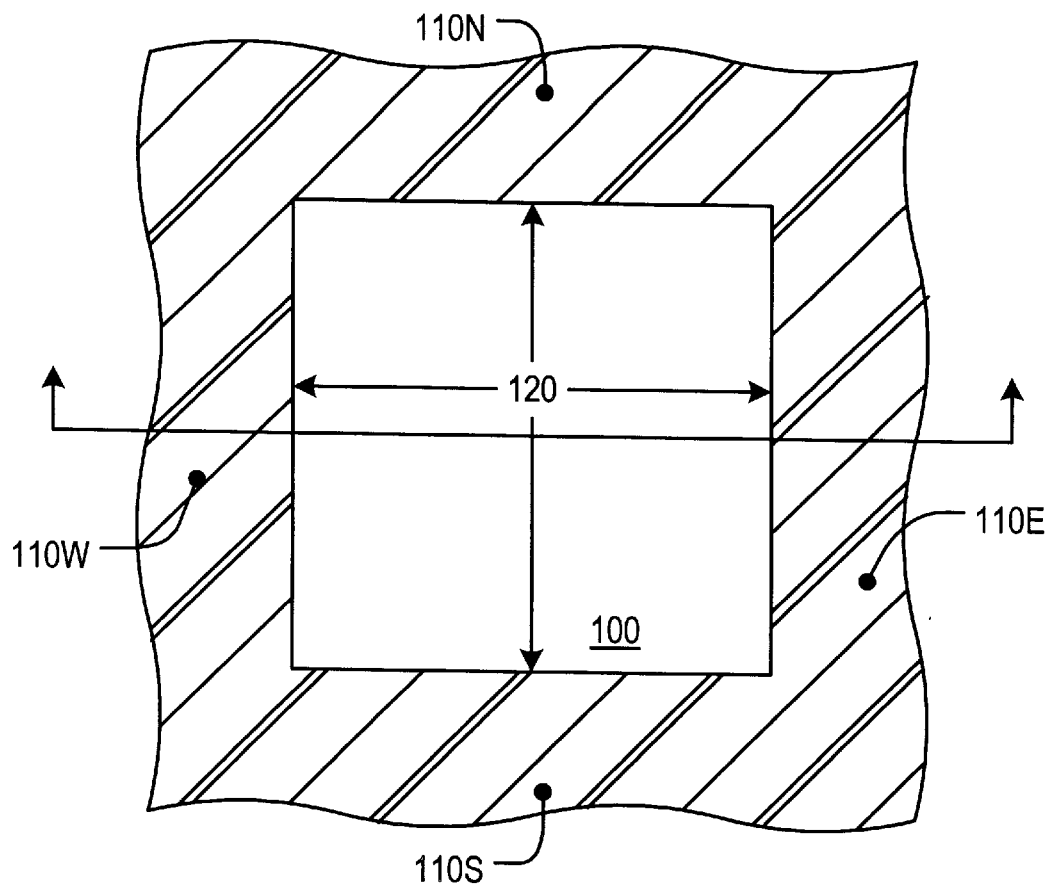
FIG. 1a is a partial top-plan view of a semiconductor substrate with an isolation structure forming a rectangular ring and surrounding the active region of the transistor.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but, on the contrary, the intention is to cover all modifications, equivalents, and alternatives falling within the spirit and scope of the present invention as defined by the appended claims.

DETAILED DESCRIPTION OF THE INVENTION

Figure 1B:
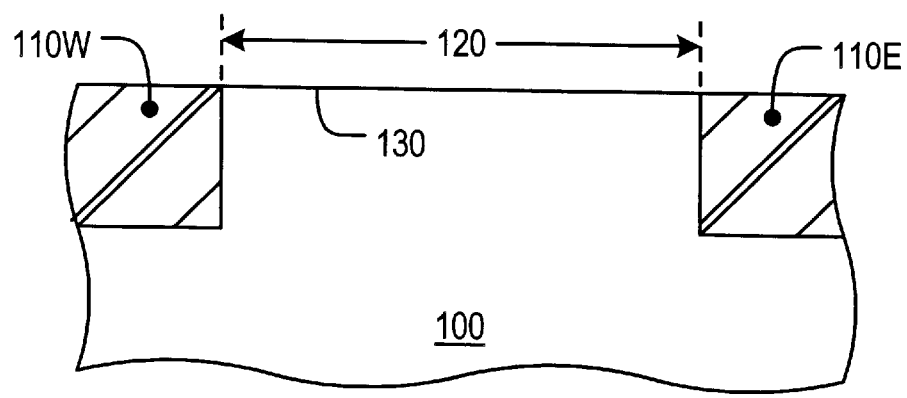

Turning now to the drawings, FIGS. 1a and 1b are a partial top-plan view and a partial cross-sectional view, respectively, of a semiconductor substrate 100 where the transistor will be formed. Semiconductor substrate 100 preferably comprises lightly doped n-type or p-type silicon having a resistivity of approximately 12 Ω-cm. At least one isolation structure 110 is formed to surround and electrically isolate active region 120 of the transistor. Isolation structure 110 is shown as a shallow trench structure filled with a dielectric such as oxide and forming a rectangular ring around active region 120 of the transistor. The formation of shallow trench isolation structures such as isolation structure 110 is typically accomplished by anisotropically etching a trench shaped void into semiconductor substrate 100, depositing a dielectric such as CVD oxide into the trench shaped void, and removing the dielectric exterior to the trench. The removal of the excess dielectric is preferably accomplished with a chemical-mechanical polish possibly in combination with traditional mask and etch processes. Isolation structure 110 may alternatively comprise, for example, LOCOS structures as are well known in the art. LOCOS structures are generally fabricated by oxidizing semiconductor substrate 100 in the presence of an oxidation inhibiting mask such as a patterned silicon nitride layer. LOCOS isolation structures, however, result in a non-planar upper surface of silicon substrate 100 due to the tendency of the oxidation process to extend outward from the upper surface. In addition, the LOCOS structures include a bird's beak which undesirably encroaches upon the active region of the transistor.

Figure 2:
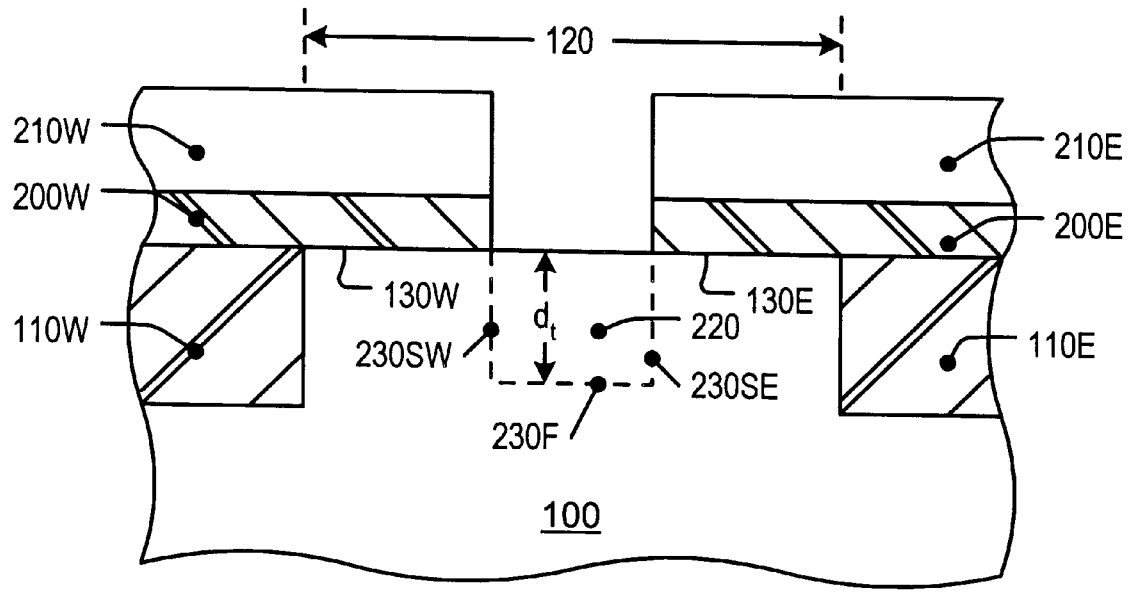
FIG. 2 is a subsequent processing step to FIG. 1b in which a layer of sacrificial oxide and a layer of photoresist are patterned to expose part of the upper surface of the semiconductor substrate and then the semiconductor substrate is etched to form a channel trench.

Turning now to FIG. 2, a channel trench 220 is formed in the active region 120. The formation of channel trench 220 preferably includes depositing a sacrificial dielectric layer 200 (200W and 200E are shown) on semiconductor substrate 100 followed by depositing a photoresist layer 210 (210W and 210E are shown) on sacrificial dielectric layer 200. Composite layer of sacrificial layer 200 and photoresist layer 210 is then patterned to expose part of the upper surface 130 (130W and 130E are shown) of semiconductor substrate 100 in active region 120. In a presently preferred embodiment, sacrificial dielectric layer 200 comprises a CVD oxide formed from a TEOS source. In an alternative embodiment, not shown, sacrificial dielectric layer 200 may comprise a composite of an oxide layer and a silicon nitride layer. The formation of channel trench 220 is preferably accomplished with an anisotropic plasma etch process. In an embodiment in which semiconductor substrate 100 comprises silicon, a chlorinated plasma etch can be suitably used to achieve the desired selectivity with respect to patterned layers 200 and 210. Trench floor 230F is then located a distance $d_t$ below upper surface 130 of semiconductor substrate 100. The present invention contemplates a transistor channel formed along vertical sidewalls 230S (230SW and 230SE are shown) of trench 220. Because it is possible to etch extremely shallow trenches (i.e., $d_t \leq 0.2$ μm) with good variability control, transistors with extremely short channel lengths (i.e., channel length $\leq 0.2$ μm) can be fabricated. The vertical orientation of the channel in the preferred embodiment removes the minimum channel length constraints typically found in conventional semiconductor transistors in which the channel length is oriented substantially parallel to the upper surface of the semiconductor substrate and is defined by a photolithography process.

Figure 3:
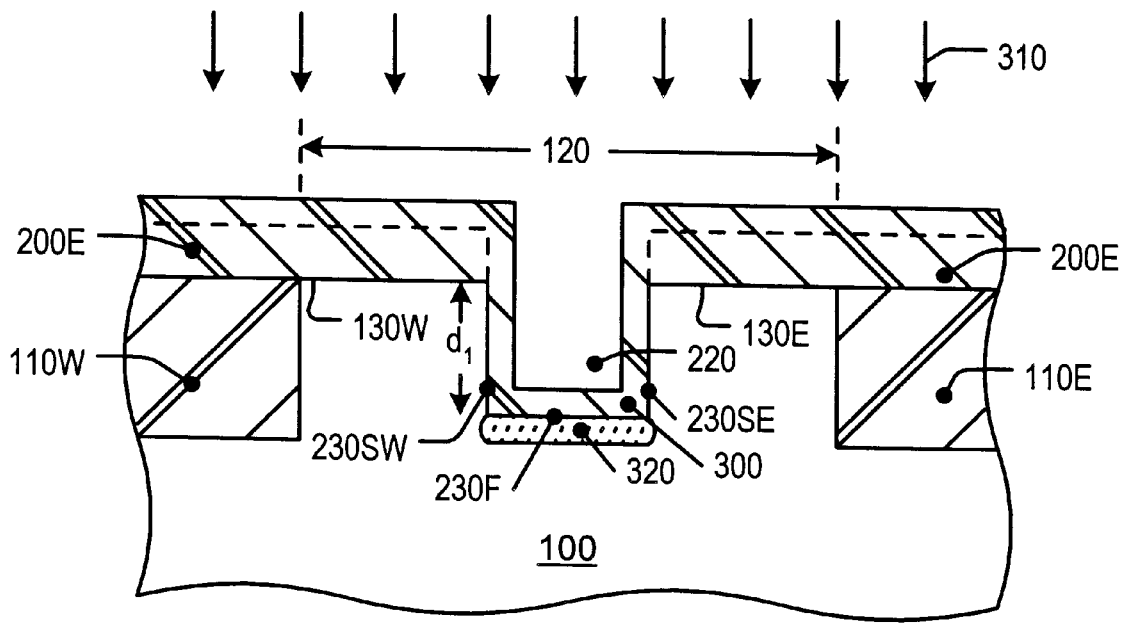
FIG. 3 is a subsequent processing step to FIG. 2 in which n-type or p-type impurities are implanted through the sacrificial oxide layer into an area below the trench floor.

Turning now to FIG. 3, an additional sacrificial layer 300 is deposited on trench floor 230F, on trench sidewalls 230S, and on existing sacrificial layer 200. Additional sacrificial layer 300 may again comprise a CVD oxide formed from a TEOS source or alternatively a composite of an oxide layer and a silicon nitride layer. Impurities 310 are then introduced through the use of ion implantation into a first source/drain region 320 located a first depth d i below upper surface 130 of semiconductor substrate 100 and close to (i.e., within 0.1 μm of ) trench floor 230F. First depth $d_1$ is greater than trench depth $d_t$. Impurities 310 may comprise n-type or p-type dopants. Boron may be used as a p-type dopant, and arsenic or the less suitable phosphorus may be used as an n-type dopant. Due to the presence of sacrificial oxide layer 200 and additional sacrificial layer 300, the ion implantation is limited to source/drain region 320. In both the n-channel and p-channel embodiments, the peak ion concentration in first source/drain region 320 should preferably exceed approximately $10^{19}$ atoms/cm$^3$.

Figure 4:
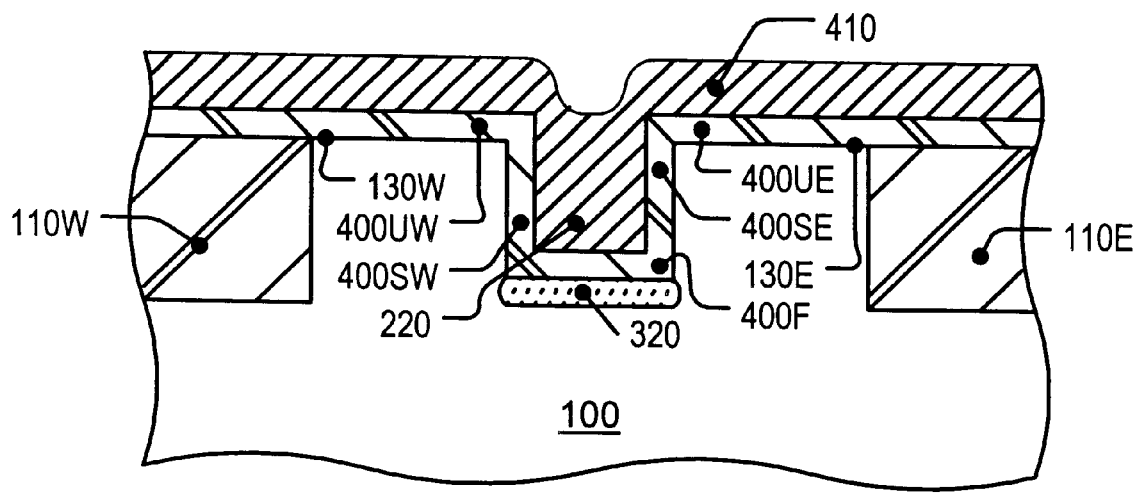
FIG. 4 is a subsequent processing step to FIG. 3 in which polysilicon is deposited over a substantially uniform dielectric layer such that it fills the channel trench.

Turning now to FIG. 4, sacrificial layer 200 and additional sacrificial layer 300 have been removed. A substantially uniform gate dielectric layer 400 (400F, 400SW, 400SE, 400UW, and 400UE are shown) is then grown on exposed upper surface 130 of semiconductor substrate 100. Formation of gate dielectric layer 400 is preferably achieved by a thermal oxidation process such that gate dielectric layer 400 comprises silicon dioxide. In alternative embodiments, Formation of gate dielectric layer 400 may be performed in a thermal oxidation furnace using temperatures of approximately 700–900 ° C. or, alternatively, in a rapid-thermal-anneal apparatus in which semiconductor substrate 100 is subjected to a temperature of approximately 700–1000 ° C. for a relatively short (i.e., less than 20 minutes) duration. A thickness of gate dielectric layer 400 is preferably between 15and 200 Å. Conductive gate layer 410 is then deposited upon the semiconductor substrate such that it fills trench region 220. The deposition of conductive gate layer 410 is preferably performed under conditions conducive to producing a substantially conformal film. In one embodiment, a low pressure (i.e., less than approximately 2 torrs) chemical vapor deposition process is used to deposit a layer of polysilicon.

Figure 5:
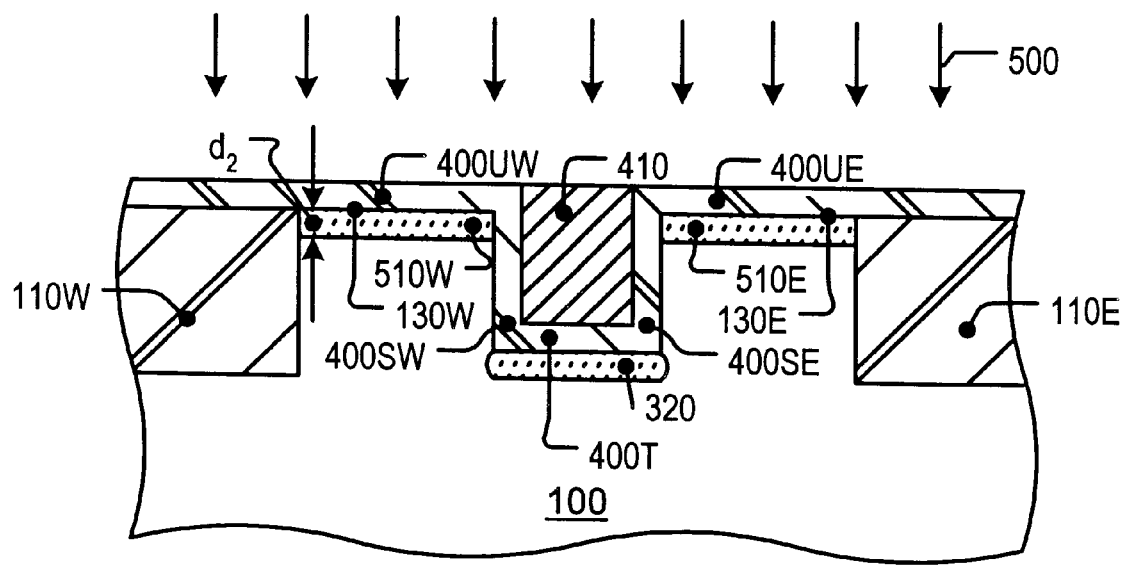
FIG. 5 is a subsequent processing step to FIG. 4 in which the polysilicon is planarized and impurities are then implanted into the polysilicon and into the upper surface of the semiconductor surface exterior to the trench.

Turning now to FIG. 5, where conductive gate layer 410 exterior to the channel trench has been removed. Removal of conductive gate layer 410 exterior to the channel trench may be accomplished by a planarization process, for example, a chemical-mechanical polish. An upper surface of conductive layer 410 is now at the same level as an upper surface of gate dielectric 400. Impurities 500 are then introduced into conductive gate layer 410 and second source/drain regions 510 (510W and 51 0E are shown). Impurities 500 may be introduced in a diffusion tube or through ion implantation. In an embodiment where conductive gate layer comprises polysilicon, the introduction of impurities may also be accomplished in situ during deposition of the polysilicon. The sheet resistivity of the conductive gate should preferably be less than approximately 500 Ω/sq. Second source/drain region 510 is located a second depth $d_2$ below and close to (i.e., within 0.03 μm of) upper surface 130 of semiconductor substrate 100. Second depth $d_2$ is less than trench depth $d_t$.

Figure 6:
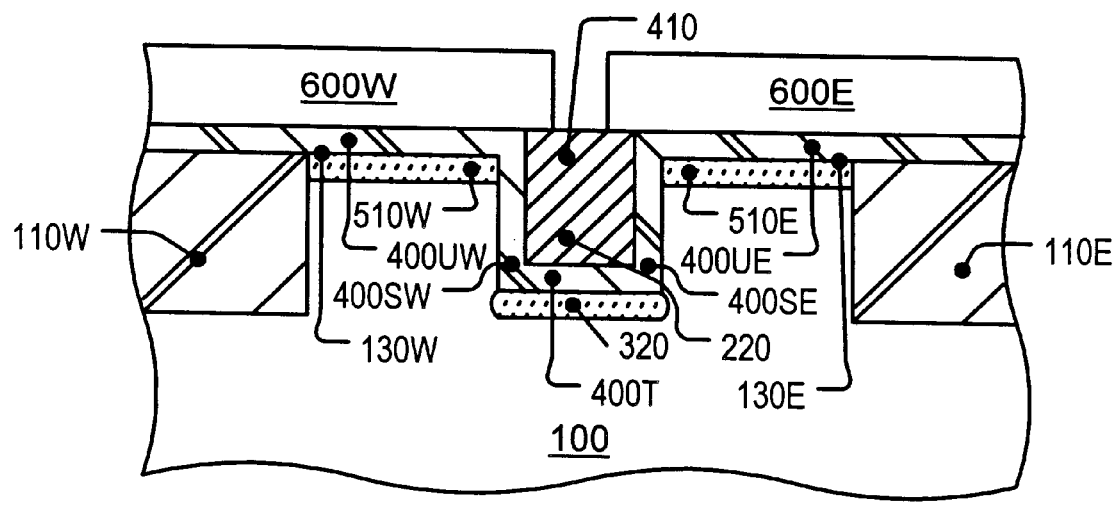
FIG. 6 is a subsequent processing step to FIG. 5 in which a layer of photoresist is blanket-deposited over the structure and then patterned to expose a region of the polysilicon.

In FIG. 6, a photoresist layer 600 (600W and 600E are shown) is blanket-deposited over the entire structure. Photoresist layer 600 is then patterned using photolithography to expose a region of the upper surface of conductive gate layer 410. By adjusting the width of the pattern using the appropriate photolithography, different widths of the upper surface of conductive gate layer 410 may be exposed.

Figure 7A:
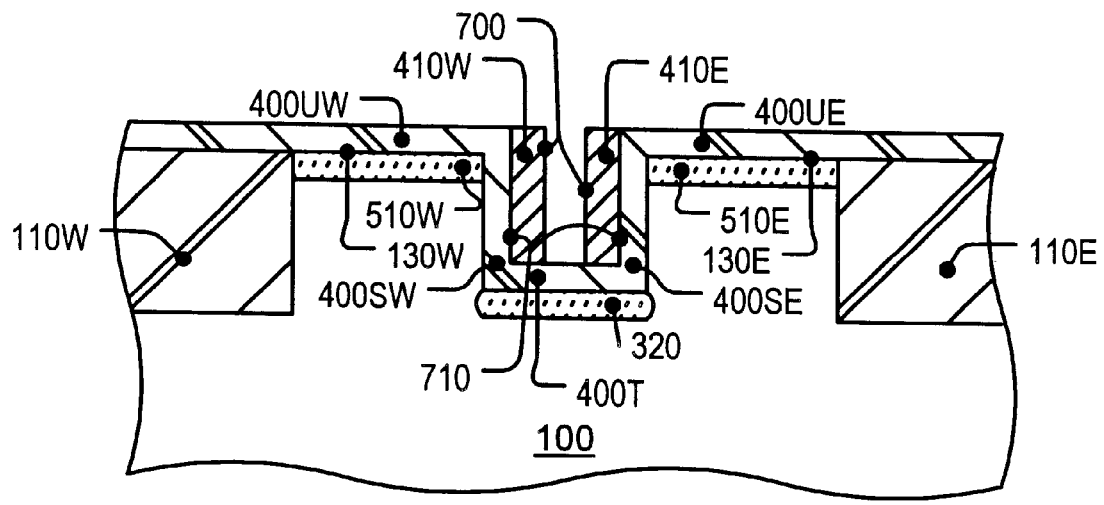
FIG. 7a is a subsequent processing step to FIG. 6 in which the exposed region of the polysilicon is etched away to form the conductive gate structure.

In FIG. 7a, conductive gate layer 410 is now anisotropically etched, preferably using a plasma etch process, until gate layer 410 is just cleared from inside the trench 220. The etch process is performed with a minimum overetch (i.e., the duration of the overetch is less than 10% of the duration of the main etch process). By using an anisotropic etch and minimizing the overetch, a conductive gate structure 410

(410W and 410E are shown) is formed with substantially vertical exterior sidewalls 700 and substantially vertical interior sidewalls 710. Exterior sidewalls 710 are in contact with the gate dielectric 400SW and 400SE. Depending on the way that photoresist layer 600 is patterned, gate structure 410 may comprise one or more separate portions. One or more transistors having a common source and drain but separate gates may be formed using this method.

Figure 7B:
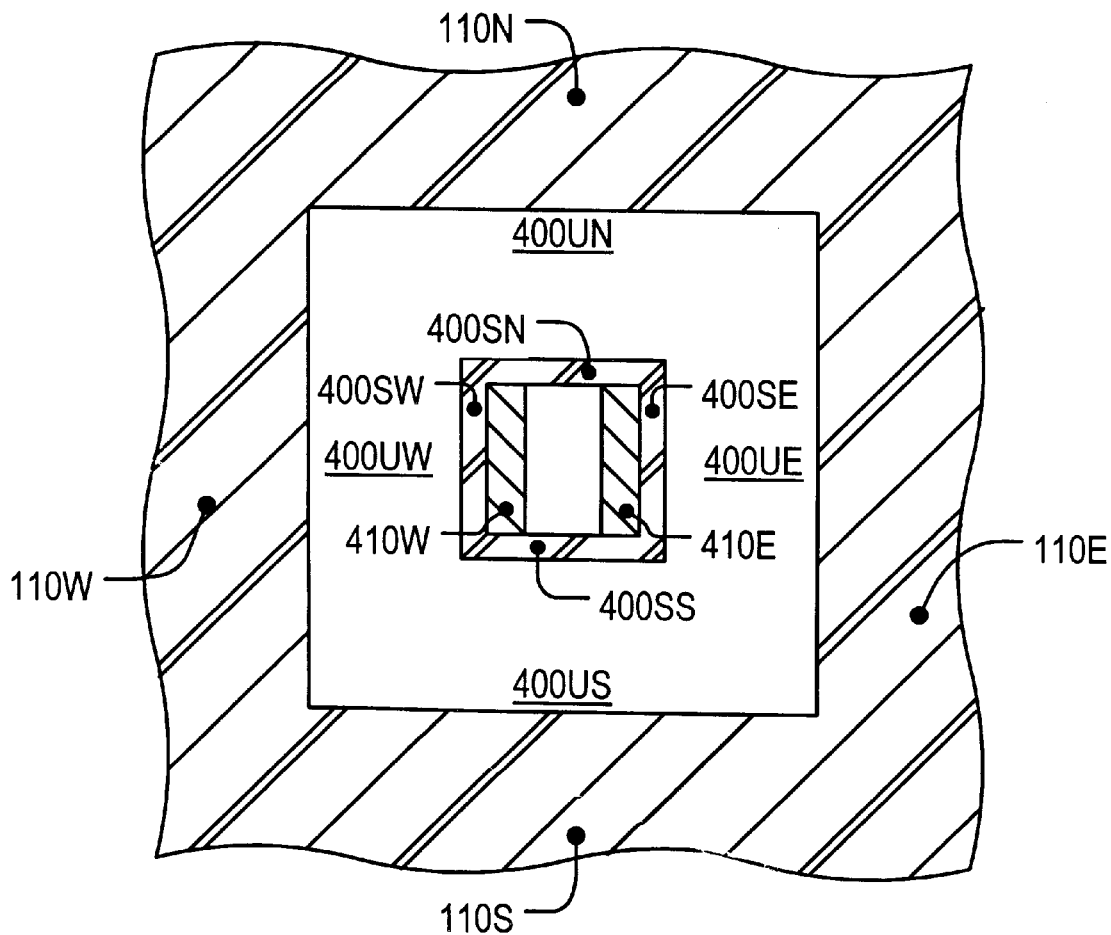

FIG. 7b is a top-plan view of FIG. 7a. It shows, from the center out, separate conductive gate structures 410W and 410E, the vertical portion of gate dielectric 400S (400SN, 400SE, 400SS, and 400SW are shown) in contact with conductive gate structure 410 and the trench sidewalls, the horizontal portion of gate dielectric 400U (40OUN, 400UE, 400US, and 400UW are shown), and isolation structures 110 (110N, 110E, 110S, and 110W are shown).

It will be appreciated to those skilled in the art having the benefit of this disclosure that this invention is capable of forming a transistor having an effective channel length that is shorter than the minimum feature size resolvable by a photolithography exposure device. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method of forming a transistor comprising:

providing a semiconductor substrate;

forming a channel trench in said semiconductor substrate, wherein said channel trench comprises trench sidewalls and a trench floor;

introducing a first impurity distribution into a first source/drain region of said semiconductor substrate exclusively beneath said trench floor;

forming a gate dielectric layer on said trench floor, said trench sidewalls, and on an upper surface of said semiconductor substrate;

forming a conductive gate exclusively upon said gate dielectric layer within the confines of said trench and planarized with respect to the portion of the gate dielectric layer formed on the upper surface of the semiconductor substrate;

subsequent to forming said conductive gate, introducing a second impurity distribution into a second source/drain region of said semiconductor substrate laterally external to said channel trench and adjacent said trench sidewalls; and subsequent to introducing said second impurity distribution, etching said conductive gate to form a pair of gate structures upon the gate dielectric layer that resides on respective said trench sidewalls such that each of said pair of gate structures remains planarized with respect to the portion of the gate dielectric formed on the upper surface of the semiconductor substrate.

2. The method as recited in claim 1, further comprising forming an isolation structure within said semiconductor substrate in a region laterally spaced from said channel trench.

3. The method as recited in claim 2, wherein the step of forming said isolation structure comprises forming a LOCOS isolation structure.

4. The method as recited in claim 1, wherein the step of forming said channel trench comprises:

forming a sacrificial oxide layer on said upper surface of said semiconductor substrate;

forming a photoresist layer on said sacrificial oxide layer;

paterning said photoresist layer and said sacrificial oxide layer to expose said upper surface of said semiconductor substrate;

anisotropically etching exposed upper surface of said semiconductor substrate to form said channel trench.

5. The method as recited in claim 1, further comprising, prior to the step of introducing said first impurity distribution, depositing a sacrificial implant displacement oxide layer on said trench sidewalls and said trench floor of said channel trench.

6. The method as recited in claim 1, wherein the step of introducing said first and said second impurity distributions comprises implantation of p-type boron dopants or n-type dopants selected from the group consisting of phosphorus and arsenic, and wherein a peak concentration of said first and said second source/drain impurity distributions is greater than approximately $10^{19}$ atoms/cm$^3$.

7. The method as recited in claim 1, wherein the step of forming said uniform thickness gate dielectric comprises thermally oxidizing said semiconductor surface and said channel trench, and wherein a thickness of said gate dielectric is approximately between 15 and 200 angstroms.

8. The method as recited in claim 1, wherein the steps of forming said conductive layer and etching said conductive gate to form said pair of gate structures comprise:

chemically vapor depositing polysilicon into said channel trench at a pressure less than approximately 2 torrs;

introducing n-type or p-type impurities into said polysilicon such that a sheet resistivity of said polysilicon is less than approximately 500 Ω/sq;

blanket depositing a photoresist layer;

patterning said photoresist layer such that a middle section of said polysilicon is exposed; and etching said middle section of said polysilicon to form said pair of gate structures.

* * * * *